(12) United States Patent
Bathurst et al.

(10) Patent No.: US 10,804,127 B2
(45) Date of Patent: Oct. 13, 2020

(54) ELECTROSTATIC CLEANING DEVICE

(71) Applicant: Apple Inc., Cupertino, CA (US)

(72) Inventors: Stephen P. Bathurst, Lafayette, CA (US); John A. Higginson, Santa Clara, CA (US); Dariusz Golda, Redwood City, CA (US); Hyeun-Su Kim, Palo Alto, CA (US)

(*) Notice: Subject to any disclaimer, the term of this patent is extended or adjusted under 35 U.S.C. 154(b) by 190 days.

(21) Appl. No.: 15/562,738

(22) PCT Filed: Mar. 14, 2016

(86) PCT No.: PCT/US2016/022383
§ 371 (c)(1),
(2) Date: Sep. 28, 2017

(87) PCT Pub. No.: WO2016/160322
PCT Pub. Date: Oct. 6, 2016

(65) Prior Publication Data
US 2018/0076076 A1  Mar. 15, 2018

Related U.S. Application Data

(60) Provisional application No. 62/141,450, filed on Apr. 1, 2015.

(51) Int. Cl.
*H01L 21/67* (2006.01)
*H01L 21/677* (2006.01)
(Continued)

(52) U.S. Cl.
CPC .......... *H01L 21/67721* (2013.01); *B08B 6/00* (2013.01); *H01L 21/67028* (2013.01); *H01L 21/67288* (2013.01); *H01L 21/6833* (2013.01)

(58) Field of Classification Search
CPC ................. H01L 21/67221; H01L 21/67228
See application file for complete search history.

(56) References Cited

U.S. PATENT DOCUMENTS 6,500,268 B1  12/2002  Henley
6,856,376 B2  2/2005  Heerens et al.
(Continued)

FOREIGN PATENT DOCUMENTS

JP  H08 167643 A  6/1996
JP  H11 87457 A   3/1999
(Continued)

OTHER PUBLICATIONS

PCT International Search Report and Written Opinion for International Application No. PCT/US20161022383, dated May 3, 2016, 12 pages.

*Primary Examiner* — Michael D Jennings
(74) *Attorney, Agent, or Firm* — Jaffery Watson Mendonsa & Hamilton LLP

(57) ABSTRACT

An electrostatic cleaning device, mass transfer tool, and method of operation are disclosed. In an embodiment an electrostatic cleaning device includes a cleaning electrode area including a first electrode pattern, a first trace line connected to the first electrode pattern, and a dielectric layer covering the cleaning electrode and the first trace line. In an embodiment, a mass transfer tool includes a translatable transfer head assembly that is translatable over a carrier substrate stage, a receiving substrate stage, and an electrostatic cleaning stage.

21 Claims, 16 Drawing Sheets

(51) Int. Cl.
*B08B 6/00* (2006.01)
*H01L 21/683* (2006.01)

(56) References Cited

U.S. PATENT DOCUMENTS

| | | | |
|---|---|---|---|
| 8,791,530 B2 | 7/2014 | Bibl et al. | |
| 2014/0064904 A1* | 3/2014 | Bibl | B81C 1/0015 |
| | | | 414/751.1 |
| 2014/0071580 A1 | 3/2014 | Higginson et al. | |
| 2014/0159324 A1* | 6/2014 | Golda | H02N 13/00 |
| | | | 279/128 |

FOREIGN PATENT DOCUMENTS

| | | |
|---|---|---|
| JP | 20060032876 A | 2/2006 |
| JP | 2009099957 A | 5/2009 |

* cited by examiner

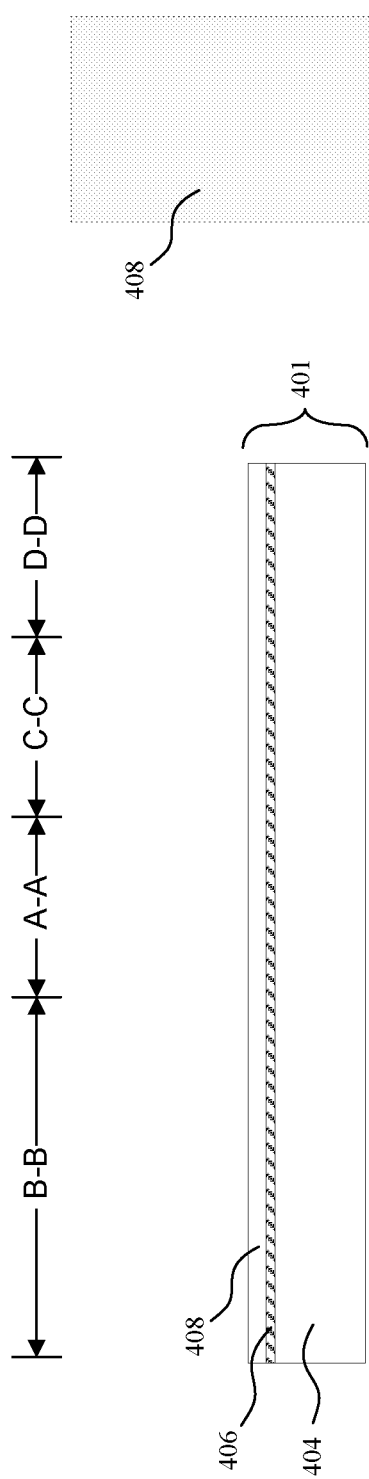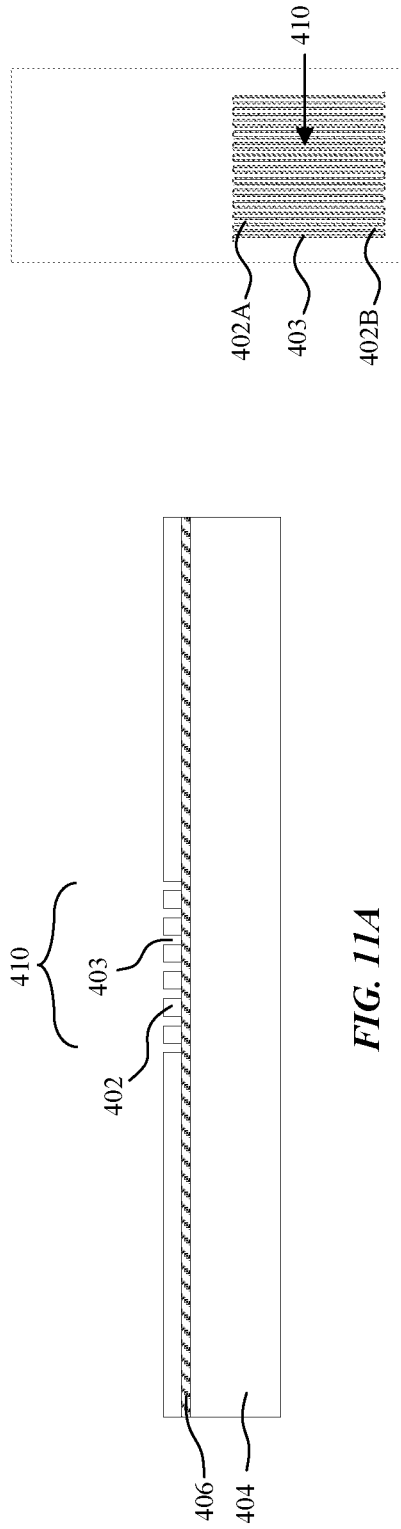

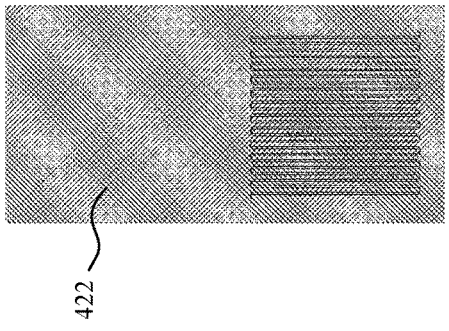
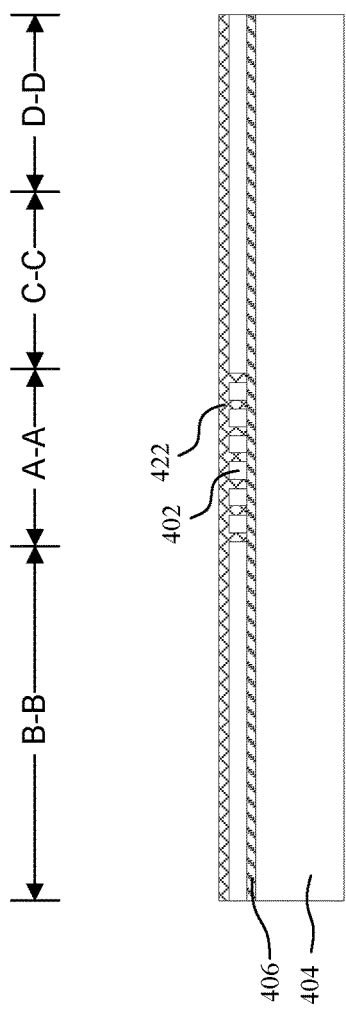
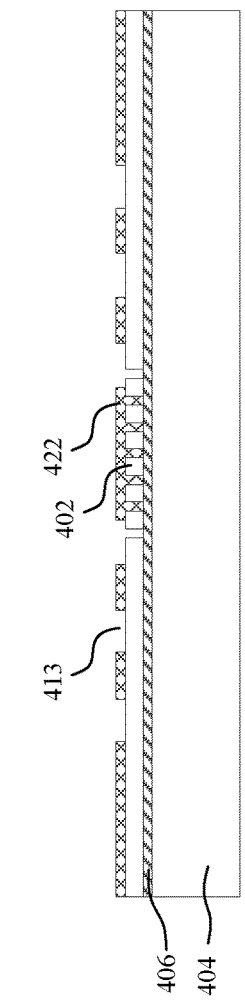
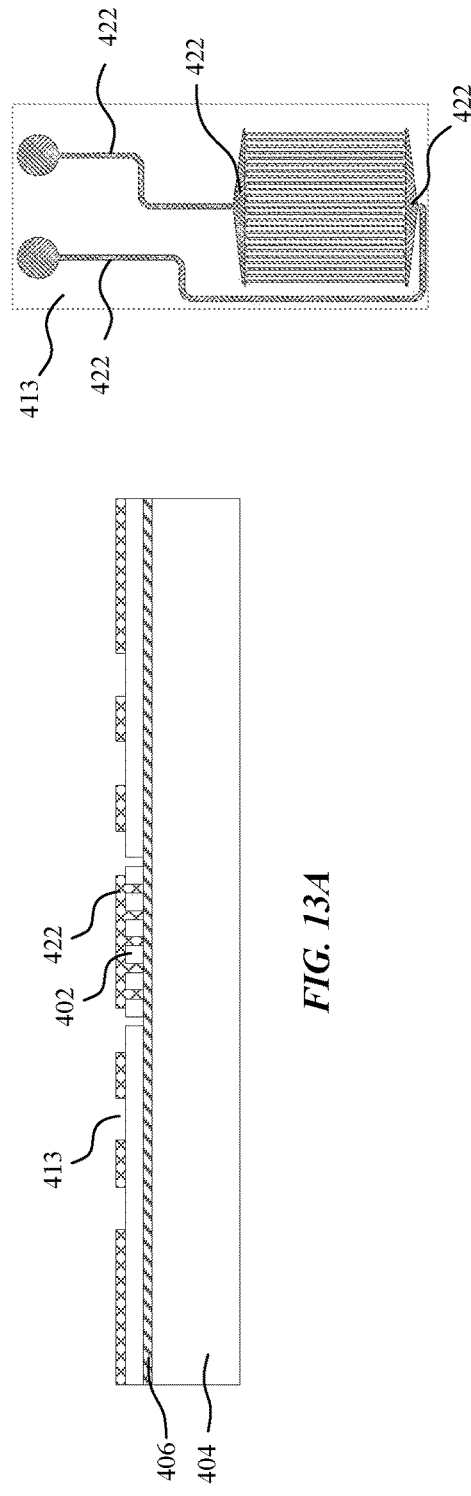

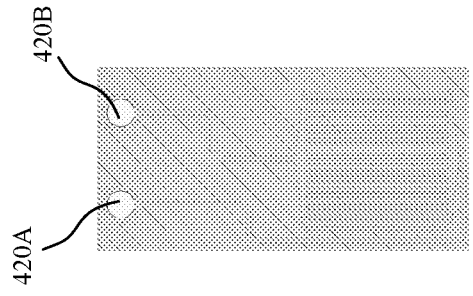
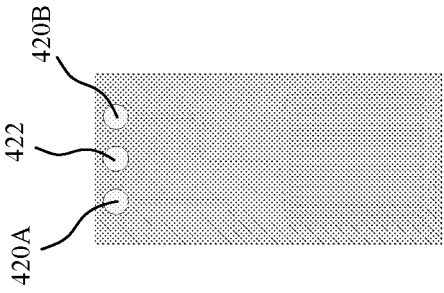
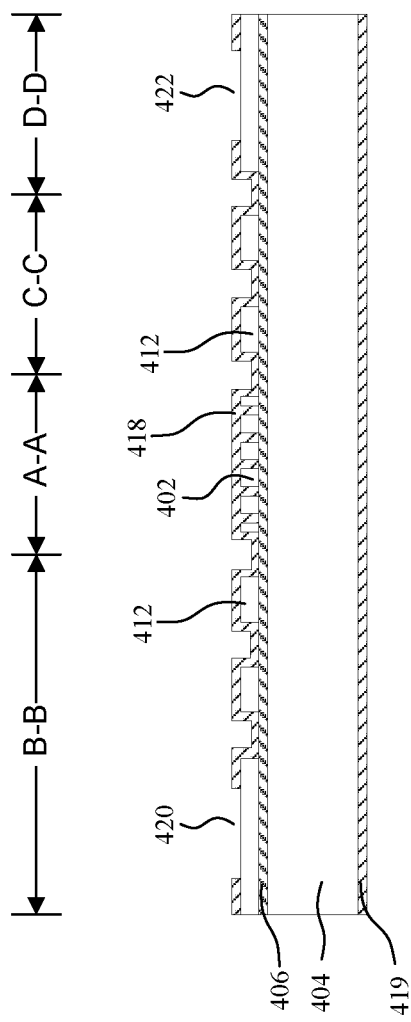
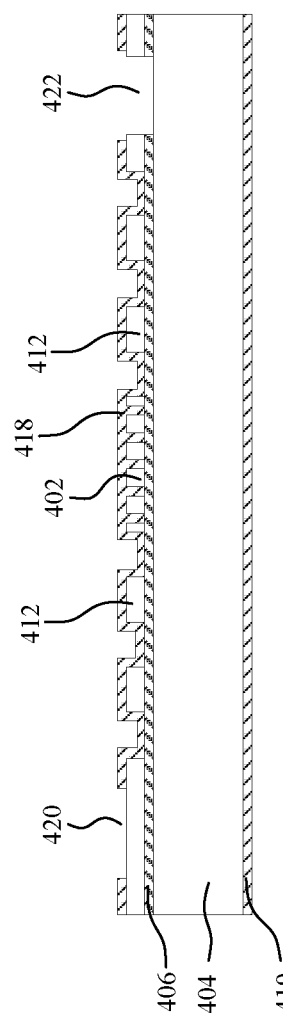
FIG. 16A
FIG. 16B
FIG. 17A
FIG. 17B

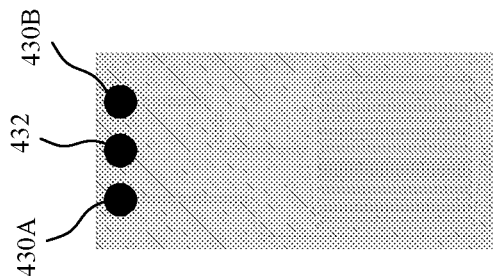
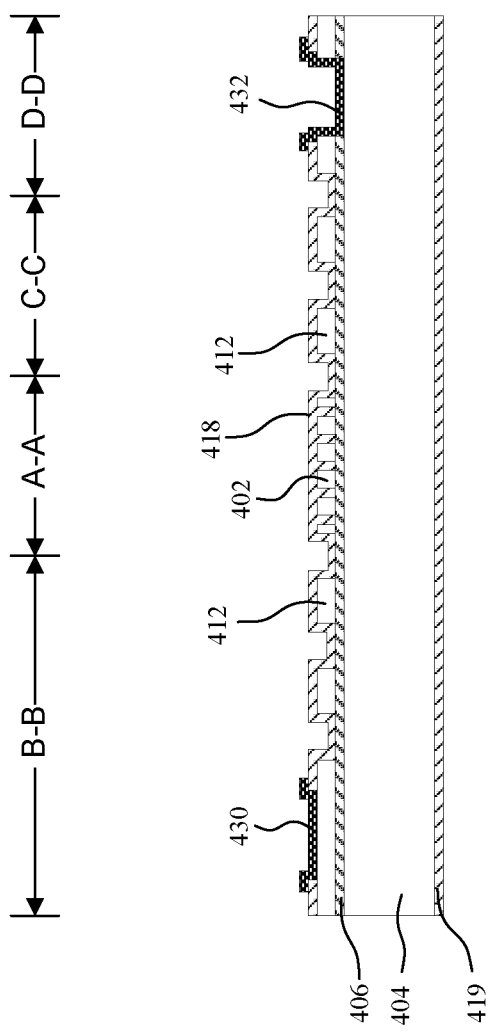
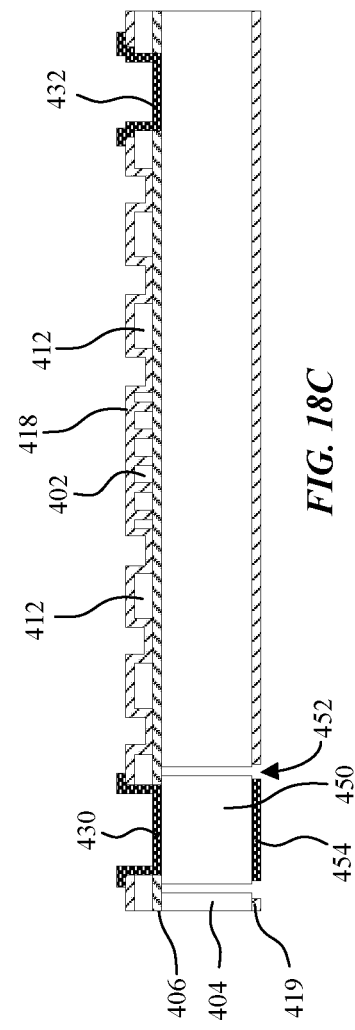
FIG. 18A
FIG. 18B
FIG. 18C

ELECTROSTATIC CLEANING DEVICE

CROSS-REFERENCE TO RELATED APPLICATIONS

This patent application is a U.S. National Phase Application under 35 U.S.C. § 371 of International Application No. PCT/US2016/022383, filed Mar. 14, 2016, entitled ELECTROSTATIC CLEANING DEVICE, which claims priority to U.S. Provisional Patent Application No. 62/141,450, filed on Apr. 1, 2015, which are herein incorporated by reference.

BACKGROUND

Field

Embodiments relate to an electrostatic cleaning device. More particularly, embodiments relate to a mass transfer tool with an integrated electrostatic cleaning device.

Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices such as "direct printing" and "transfer printing" include transfer by wafer bonding from a transfer wafer to a receiving wafer. In both traditional and variations of the direct printing and transfer printing technologies, the transfer wafer is de-bonded from a device after bonding the device to the receiving wafer. In addition, the entire transfer wafer with the array of devices is involved in the transfer process.

In one process variation described in U.S. Pat. No. 8,333,860 a transfer tool including an array of electrostatic transfer heads is used to pick up and transfer an array of micro devices from a carrier substrate to a receiving substrate. As described the transfer heads operate in accordance with principles of electrostatic grippers, using the attraction of opposite charges to pick up the micro devices.

SUMMARY

An electrostatic cleaning device, mass transfer tool, and methods of operation are described. In an embodiment an electrostatic cleaning device includes a cleaning electrode area including a first electrode pattern, a first trace line connected to the first electrode pattern, and a dielectric layer covering the cleaning electrode area and the first trace line. The cleaning area may additionally include a second electrode pattern that is interdigitated with the first electrode pattern. Additionally, a second trace line can be connected to the second electrode pattern, and the dielectric layer covers the first and second electrode patterns in the cleaning electrode area as well as the first and second trace lines.

In an embodiment, the cleaning electrode area and the one or more trace lines are formed in a silicon layer. For example, the electrostatic cleaning device may include a base substrate and an insulator layer between the silicon layer and the base substrate. Such a configuration may be formed form a silicon-on-insulator (SOI) substrate.

In an embodiment, the electrostatic cleaning device includes a plurality of separately operable cleaning electrode areas and a corresponding plurality of electrically separate first trace lines. The dielectric layer may additionally cover each cleaning electrode area and each first trace line. In such a configuration, each cleaning electrode area may additionally include a second electrode pattern interdigitated with the first electrode pattern. A corresponding plurality of electrically separate second trace lines may be connected to the second electrode patterns.

In an embodiment, a flex circuit is coupled with the first trace line. Were multiple electrode patterns and trace lines are included, the flex circuit may be coupled with the multiple trace lines. Furthermore, where multiple separately operable cleaning electrode areas are included, the flex circuit may be coupled with the one or more trace lines that correspond to the multiple separately operable cleaning electrode areas. In an embodiment, conductive contacts are electrically coupled with the trace lines. Conductive contacts can also be used to form conductive ground contacts. In a embodiment, a first plurality of conductive contacts are coupled with a plurality of electrically separate first trace lines, and a second corresponding plurality of conductive contacts are electrically coupled with a plurality of electrically separate second trace lines. A flex circuit may be coupled with the first corresponding plurality of conductive contacts, the second corresponding plurality of conductive contacts, and one or more conductive ground contacts. In an embodiment the conductive contacts may be coupled with a plurality of via plugs, for example, formed within the base substrate.

In an embodiment, a mass transfer tool includes a carrier substrate stage, a receiving substrate stage, an electrostatic cleaning stage, and a translatable transfer head assembly that is translatable over the carrier substrate stage, the receiving substrate stage, and the electrostatic cleaning stage. The translatable transfer head assembly may be coupled with a translation track, with the translatable transfer head assembly being moveable along the translation track over the carrier substrate stage, the receiving substrate stage, and the electrostatic cleaning stage. The mass transfer tool may additionally include an upward facing inspection camera. In an embodiment, the upward facing inspection camera is located between the receiving substrate stage and the carrier substrate stage. In this manner, a substrate or device carried by the translatable transfer head assembly, such as a micro pick up array, can be inspected between pick up and placement operations in order to determine whether a cleaning operation is to be performed.

In an embodiment, an electrostatic cleaning device is detachably coupleable with the electrostatic cleaning stage. The mass transfer tool may additionally include one or more voltage sources for operating or holding various components. For example, the mass transfer tool may include a pair of voltage sources to supply separate operating voltages to the electrostatic cleaning device. In an embodiment, a micro pick up array including an array of bipolar electrostatic transfer heads is detachably coupleable with the translatable transfer head assembly. The mass transfer tool may additionally include another pair of voltage sources to supply separate operating voltages to the micro pick up array.

The electrostatic cleaning device may be used for cleaning purposes and may be used in conjunction with the mass transfer of micro devices. In an embodiment, a micro device transfer and cleaning method includes picking up an array micro devices with a micro pick up array, and placing placing the array of micro devices on a receiving substrate. The micro pick up array may then be inspected to locate any micro devices that may be retained on the micro pick up array after placing the array of micro devices on the receiving substrate. These may correspond to mis-transferred micro devices. In accordance with embodiments, the micro pick up array may then be cleaned with the electrostatic cleaning device to remove any mis-transferred micro devices from the micro pick up array.

In an embodiment, cleaning of a workpiece, such as the micro pick up array, with the electrostatic cleaning device includes bringing the micro pick up array into close contact with the electrostatic cleaning device, applying a voltage to the electrostatic cleaning device to build up charge on the electrostatic cleaning device, withdrawing the micro pick up array from the electrostatic cleaning device. In an embodiment, the voltage is then removed from the electrostatic cleaning device to remove the charge from the electrostatic cleaning device, and the electrostatic cleaning device is then indexed to a clean location to ready the electrostatic cleaning device for a subsequent cleaning operation.

BRIEF DESCRIPTION OF THE DRAWINGS

FIGS. 10A-18C are schematic cross-sectional side view illustrations taken along lines A-A, B-B, C-C, and D-D in FIG. 9F and schematic top view illustrations of a method of forming an electrostatic cleaning device in accordance with an embodiment.

DETAILED DESCRIPTION

Figure 1A:
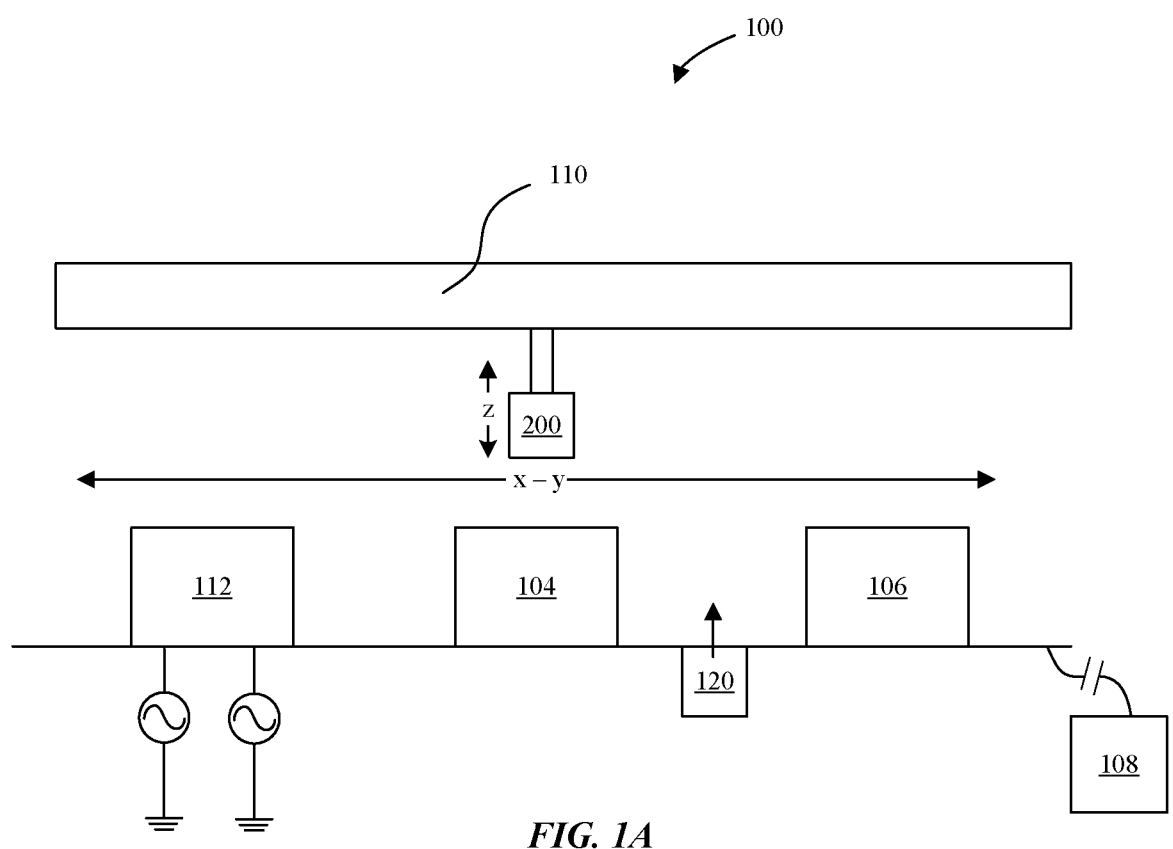
FIG. 1A is a schematic illustration of a mass transfer tool assembly in accordance with an embodiment.

Embodiments describe an electrostatic cleaning device, mass transfer tool, and methods of operation. In an embodiment, an electrostatic cleaning device includes a cleaning electrode area with a first electrode pattern, a first trace line connected to the first electrode pattern, and a dielectric layer covering the cleaning electrode area and the first trace. The cleaning electrode area may include a second electrode pattern interdigitated with the first electrode pattern and a second trace line connected to the first electrode pattern. In such a configuration the interdigitated electrodes patterns form an interdigitated bipolar electrode configuration. The electrostatic cleaning device may be integrated into a mass transfer tool for periodic cleaning of MEMS devices, such as a micro pick up array including an array of electrostatic transfer heads. In an embodiment, the mass transfer tool includes a translatable transfer head assembly, a carrier substrate stage, a receiving substrate stage, and an electrostatic cleaning stage to which the electrostatic cleaning device can be secured. In operation, the translatable transfer head assembly can be positioned over the carrier substrate stage, the receiving substrate stage, and the electrostatic cleaning stage, for example by moving along a translation track. In an embodiment, an upward facing inspection camera is located between the carrier substrate stage and the receiving substrate stage.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" or "an embodiment" means that a particular feature, structure, configuration, or characteristic described in connection with the embodiment is included in at least one embodiment. Thus, the appearances of the phrase "in one embodiment" or "an embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" or in "contact" with another layer may be directly in contact with the other layer or may have one or more intervening layers. One layer "between" layers may be directly in contact with the layers or may have one or more intervening layers.

The terms "micro" device or "micro" LED as used herein may refer to the descriptive size of certain devices or structures in accordance with embodiments. As used herein, the term "micro" is meant to refer to the scale of 1 to 300 µm. For example, each micro device may have a maximum length or width of 1 to 300 µm, 1 to 100 µm, or less. In some embodiments, the micro LEDs may have a maximum length and width of 20 µm, 10 µm, or 5 µm. However, it is to be appreciated that embodiments of the present invention are not necessarily so limited, and that certain aspects of the embodiments may be applicable to larger, and possibly smaller size scales.

In one aspect, embodiments describe an electrostatic cleaning device for removing loose contamination from the surface of a microchip or a MEMS device. A variety of types of contamination may be removed, such as dust particles, wear particles, or other accumulated contamination. Contamination may additionally include non-transferred micro devices (e.g. micro chips, micro LEDs). The electrostatic cleaning device may also be used to clean a variety of microchips or MEMS devices, such as but not limited to a micro pick up array, pivot mount, and a released carrier substrate.

In accordance with embodiments, a mass transfer tool (MTT) and method of operation are described that enable in-situ inspection and cleaning. In an embodiment, the MTT carries a micro pick up array (MPA) that, depending upon size of the MPA, may include thousands of individual electrostatic transfer heads that correspond to a pixel density, e.g. pixels per inch (PPI) on a receiving substrate. Thus a pick and place operation may pick up thousands of closely arranged micro devices from a carrier substrate and place the micro devices on a receiving substrate. It has been observed that the presence of contamination (e.g. dust particles, wear particles, micro devices, etc.) on the MPA can have detrimental effects. For example, if contamination remains on the MPA after the placement operation on the receiving substrate, the contamination may interfere with a subsequent pick up operation from a carrier substrate. Such interference might possibly prohibit picking up a large number of micro devices. Furthermore, such contamination can possibly cause physical damage to the MPA or target substrate (e.g. carrier substrate or receiving substrate) during subsequent transfer operations. Likewise, contamination on the MPA after the pick up operation can interfere with the placement operation on the receiving substrate.

In another aspect, embodiments describe a structure and method of removing contamination using electrostatic attractive force. In accordance with embodiments, cleaning force is applied to the ECD quickly, for example, on the order of 10 milliseconds or less. The electrostatic cleaning force at the surface of the ECD is stronger than adhesion forces of the contamination on the device being cleaned. Furthermore, precise alignment of the microchip or MEMS device being cleaned and the ECD is not required. In accordance with embodiments, the speed of charge build up on the ECD is a determinant factor in the cleaning cycle time, with small operating capacitances resulting in faster cycle times. Accordingly, operating capacitances are related to the target contamination sizes. In an embodiment, rapid cleaning of contamination on the order of 0.25 µm to 25 µm, for example, may be achieved in a matter of milliseconds. Thus, embodiments describe a mass transfer tool and method of operation with integrated in-situ inspection and a rapid cleaning operation that does not require the precise alignment of the pick and place operations. As a result, transfer efficiency of the MTT can be increased with a reduced proportion of tool down time for cleaning to operating time, thereby increasing the availability of the MTT for production and reducing the total manufacturing cost of the display or lighting units being assembled.

FIG. 1A is a schematic illustration of a mass transfer tool in accordance with an embodiment. Mass transfer tool 100 may include a transfer head assembly 200 for picking up an array of micro devices from a carrier substrate held by a carrier substrate stage 104 and for transferring and releasing the array of micro devices onto a receiving substrate held by a receiving substrate stage 106. In an embodiment, an upward facing inspection camera 120 is located between the carrier substrate stage 104 and the receiving substrate stage 106. In this manner, a device retained by the transfer head assembly 200 may be inspected by the inspection camera while the transfer head assembly 200 moves between the carrier substrate stage 104 and receiving substrate stage 106 to verify efficacy of the transfer operations. Operation of mass transfer tool 100 and transfer head assembly 200 may be controlled at least in part by a computer 108. Computer 108 may control the operation of transfer head assembly 200 based on feedback signals received from various sensors, strain sensing elements, reference gages located on a pivot mount. For example, transfer head assembly 200 may include an actuator assembly for adjusting an associated micro pick up array (MPA) 103 retained by the transfer head assembly with at least three degrees of freedom, e.g., tipping, tilting, and movement in a z direction, based on feedback signals received from sensors associated with a pivot mount that carries MPA 103. Computer 108 may also control movement of the transfer head assembly 200 along translation track 110 over the carrier substrate stage 104, receiving substrate stage 106, and cleaning stage 112 for holding an ECD. Additional actuators may be provided, e.g., between mass transfer tool 100 structural components and transfer head assembly 200, cleaning stage 112, carrier substrate stage 104, or receiving substrate stage 106, to provide movement in the x, y, or z direction for one or more of those sub-assemblies. For example, a gantry may support transfer head assembly 200 and move transfer head assembly 200 along an upper beam, e.g., in a direction parallel to an axis of motion of translation track 110. Thus, in an embodiment an array of electrostatic transfer heads on MPA 103, supported by transfer head assembly 200, and a target substrate (e.g. supported by cleaning stage 112, carrier substrate stage 104, or receiving substrate stage 106) may be precisely moved relative to each other within all three spatial dimensions.

Figure 1B:
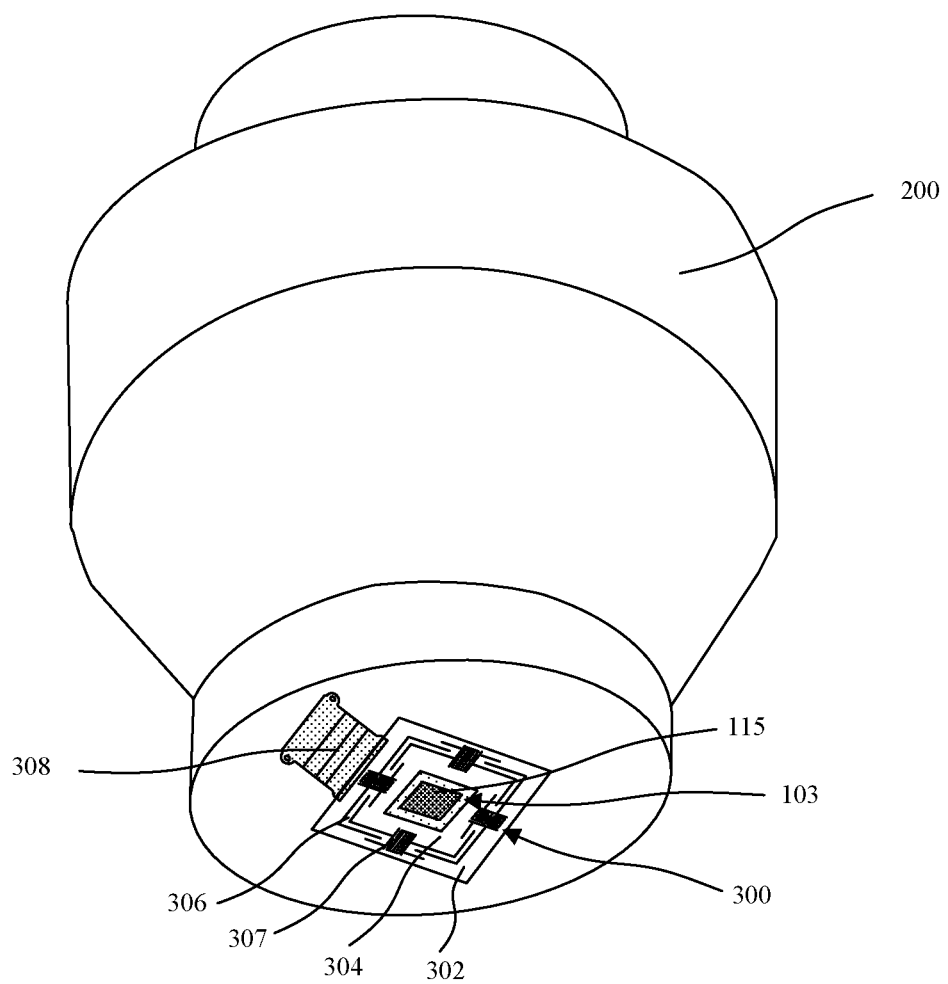
FIG. 1B is a perspective view illustration of a micro pick up array and pivot mount mounted onto a transfer head assembly in accordance with an embodiment.

Referring to FIG. 1B, a perspective view of a transfer head assembly 200 is shown in accordance with an embodiment. A transfer head assembly 200 may be used in combination with mass transfer tool 100 to transfer micro devices to or from a substrate, e.g., receiving substrate or carrier substrate, using micro pick up array (MPA) 103 which is supported by a pivot mount 300. More particularly, transfer head assembly 200 may provide for negligible lateral or vertical parasitic motion for small movements of MPA 103, e.g., motion less than about 5 mrad about a neutral position. Accordingly, transfer head assembly 200 may be incorporated in mass transfer tool 100 to adjust an MPA 103 relative to mass transfer tool 100. Thus, transfer head assembly 200 may be fixed to a chassis of mass transfer tool 100, e.g., at a location along translation track 110.

As illustrated, the pivot mount 300 may include a base 302, a pivot platform 304, a plurality of primary spring arms 306, and a plurality of secondary spring arms 307, and the MPA 103 supporting a transfer head array 115 is mounted on the pivot platform 304. In an embodiment, the transfer head array 115 is an electrostatic transfer head array 115, where each transfer head operates in accordance with electrostatic principles to pick up and transfer a corresponding micro device. In an embodiment each electrostatic transfer head has a localized contact point characterized by a maximum dimension of 1-300 µm in both the x- and y-dimensions. In an embodiment, each electrostatic transfer head has a maximum dimension of 1 to 100 µm, or less. In some embodiments, each electrostatic transfer head has a maximum length and width of 20 µm, 10 µm, or 5 µm.

In an embodiment, the pivot mount 300 may communicate and send feedback signals to the mass transfer tool 100 through one or more electrical connections, such as a flex circuit 308. Feedback may include analog signals from various sensors, strain sensing elements, reference gages that are used in a control loop to regulate actuation and spatial orientation of the transfer head assembly 200. In an embodiment, the feedback signals are sent to a position sensing module located near the pivot mount 300 to reduce signal degradation by limiting a distance that analog signals must travel from a strain sensing element to the position sensing module. In an embodiment, the position sensing module is located within the transfer head assembly 200.

Figure 2A:
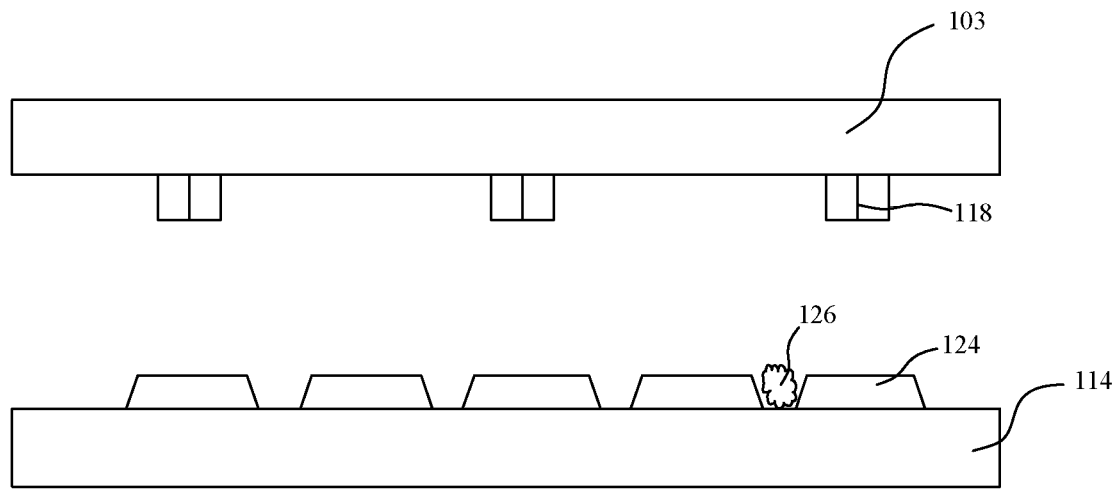
FIG. 2A is a schematic cross-sectional side view illustration of a micro pick up array positioned over a carrier substrate in accordance with an embodiment.
Figure 2B:
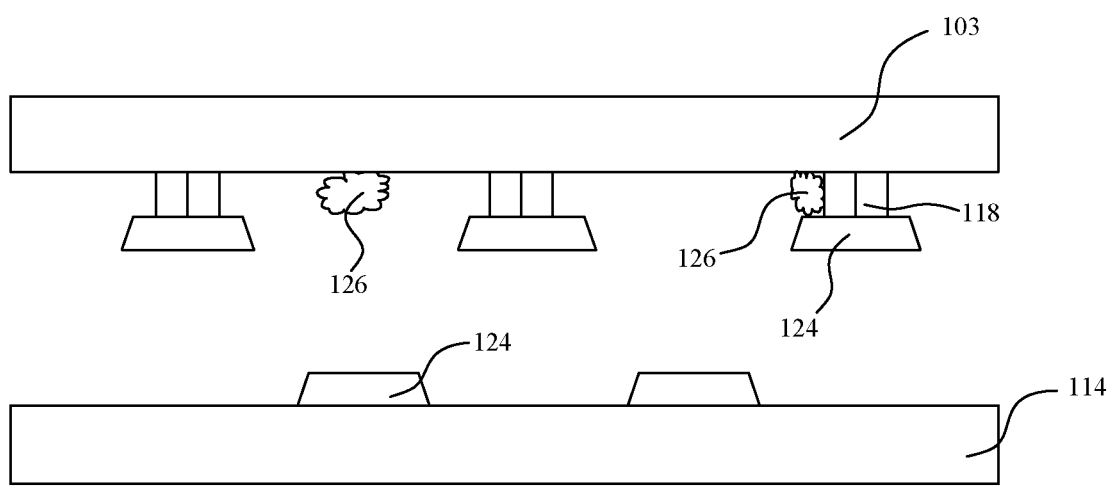
FIG. 2B is a schematic cross-sectional side view illustration of a micro pick up array after picking up an array of micro devices from a carrier substrate in accordance with an embodiment.

Referring now to FIG. 2A, a schematic cross-sectional side view illustration is provided of an MPA 103 positioned over a carrier substrate in accordance with an embodiment. As shown, the MPA 103 includes an electrostatic transfer head array 115 of electrostatic transfer heads 118. The carrier substrate 114 is supported by the carrier substrate stage 104. An array of micro devices 124 is supported by the carrier substrate 114. Micro devices 124 may be a variety of devices, such as micro chips or micro LEDs. As shown, the micro pick array 103 is positioned over the carrier substrate 114, with the electrostatic transfer heads 118 arranged such that each electrostatic transfer head 114 is positioned over a corresponding micro device 124. In an embodiment, multiple transfer heads 118 may be positioned over a single micro device 124. Referring now to FIG. 2B, a schematic cross-sectional side view illustration is provided after the MPA has picked up an array of micro devices from the carrier substrate. Also illustrated is a contamination particle 126. The contamination particle 126 may be attracted to the MPA 103 by the charged electrostatic transfer heads 118, and interconnect or bus lines running through the MPA to supply the operating voltages to the electrostatic transfer heads 118. Exemplary contamination particles 126 include dust particles, wear particles, and other contamination from the carrier substrate 114 that may accrue during fabrication and conditioning of the micro devices 124 for pick up from the carrier substrate 114.

Figure 3A:
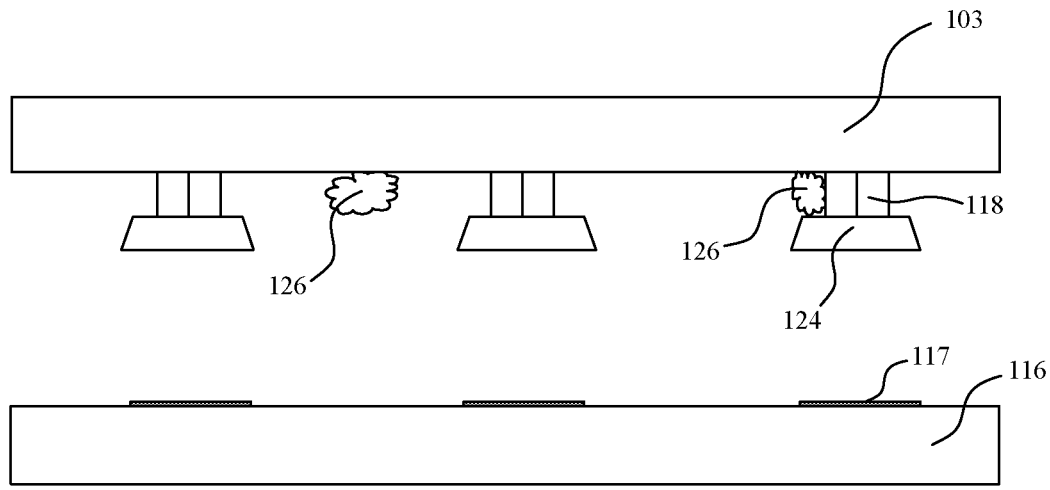
FIG. 3A is a schematic cross-sectional side view illustration of a micro pick up array positioned over a receiving substrate in accordance with an embodiment.
Figure 3B:
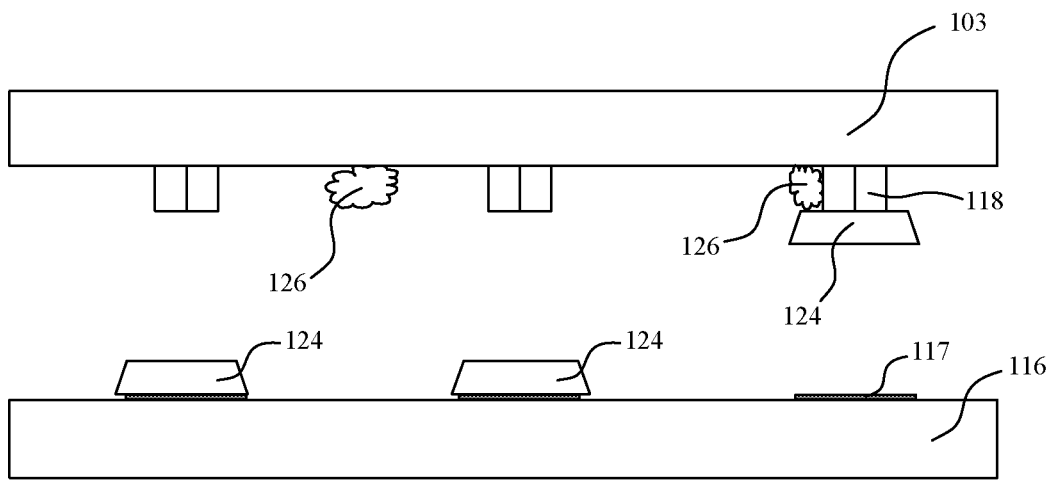
FIG. 3B is a schematic cross-sectional side view illustration of a micro pick up array after placing an array of micro devices on a receiving substrate in accordance with an embodiment.

Referring now to FIGS. 3A-3B schematic cross-sectional side view illustrations are provided of an MPA prior to and after placing an array of micro devices on a receiving substrate 116 in accordance with an embodiment. In the particular embodiment illustrated, the MPA 103 holding the array of micro devices 124 and contamination particles 126 from FIG. 2B is moved over the receiving substrate 116. The micro devices 124 are then brought into contact with contact pads 117 on the receiving substrate 116, and bonded to the receiving substrate. For example, bonding may be accomplished by the transfer of energy, e.g. heat, from the transfer head assembly to the contact pads 117 to secure the micro devices 124 to the receiving substrate. In an embodiment, the transfer of heat may cause alloy bonding, eutectic bonding, or transient liquid phase bonding between conductive layers on the micro devices 124 and corresponding contact pads 117. The micro devices 124 may then be released onto the receiving substrate 116, for example, by changing the waveform of the operating voltage(s) of the electrostatic transfer heads 118, turning off the operating voltages, and/or grounding. The MPA 103 is then moved vertically away from the receiving substrate 116, leaving the placed micro devices 124 on the receiving substrate.

In the particular embodiment illustrated in FIG. 3B, pre-existing contamination particles 126 that originated as described above with regard to FIG. 2B remain on the MPA 103. As illustrated, additional contamination 126 is now shown on the MPA. The contamination particles 126 may be attracted to the MPA 103 by the charged electrostatic transfer heads 118, and interconnect or bus lines running through the MPA to supply the operating voltages to the electrostatic transfer heads 118. Exemplary contamination particles 126 include dust particles, wear particles, and other contamination from the receiving substrate 116. Additionally, a non-transferred or mis-transferred micro device 124 remains on the MPA 103. It is to be appreciated, that the particular embodiment illustrated in FIG. 3B is illustrative of an MPA 103 with an imperfect surface that may not be suitable for subsequent transfer operations, and that embodiments are not so limited. For example, other types of contamination may be present, or different configurations of non-transferred or mis-transferred micro devices may be present on the transfer surface. Accordingly, the particular embodiment illustrated is meant to be exemplary and not limiting.

Figure 4A:
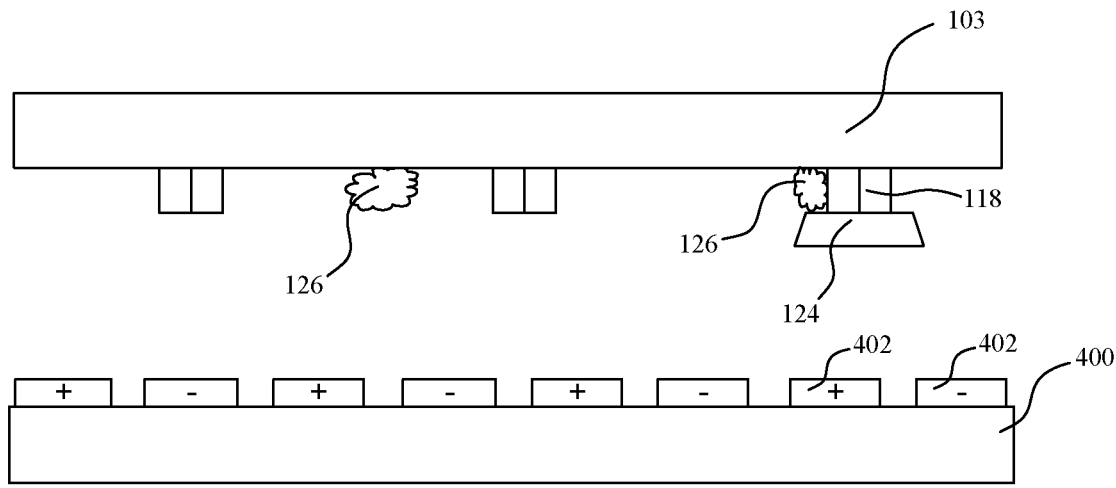
FIG. 4A is a schematic cross-sectional side view illustration of a micro pick up array positioned over an electrostatic cleaning device in accordance with an embodiment.
Figure 4B:
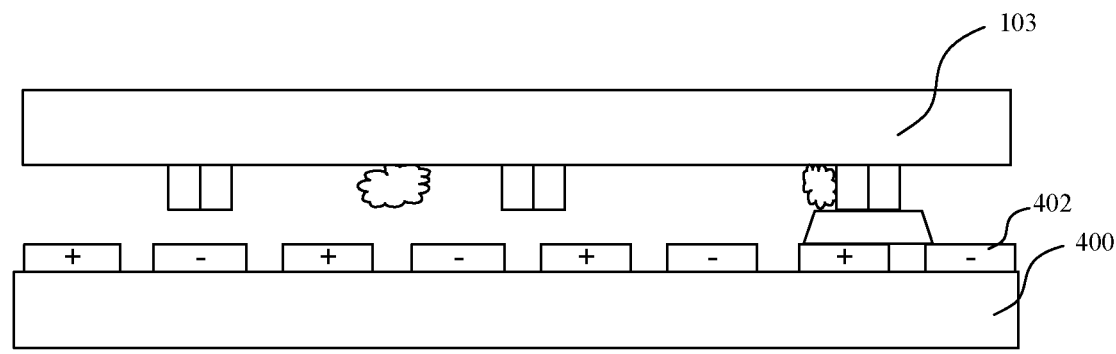
FIG. 4B is a schematic cross-sectional side view illustration of a micro pick up array into close contact with an electrostatic cleaning device in accordance with an embodiment.
Figure 4C:
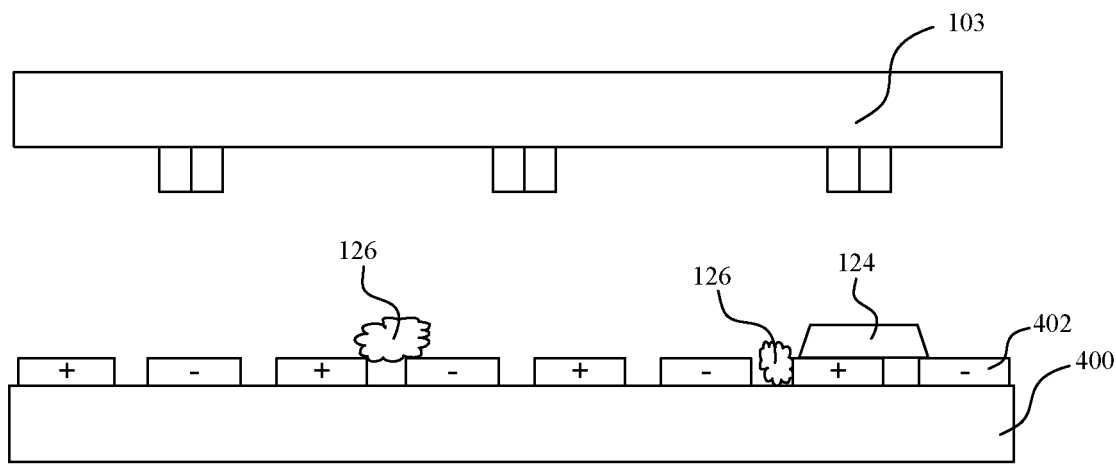
FIG. 4C is a schematic cross-sectional side view illustration of a micro pick up array after cleaning with an electrostatic cleaning device in accordance with an embodiment.

Referring now to FIGS. 4A-4C schematic cross-sectional side view illustrations are provided of an MPA prior to, during, and after cleaning with an ECD in accordance with an embodiment. As shown, the MPA 103 is positioned over the ECD in FIG. 4A, brought into close contact with the ECD in FIG. 4B, and then vertically withdrawn away from the ECD in FIG. 4C. In the particular embodiment illustrated, the contamination particles 126 and/or the non-transferred or mis-transferred micro devices from the MPA 103 illustrated in FIG. 3B are captured by and transferred from the MPA 103 to the electrodes 402 of the ECD 400 illustrated in FIG. 4C.

Figure 5:
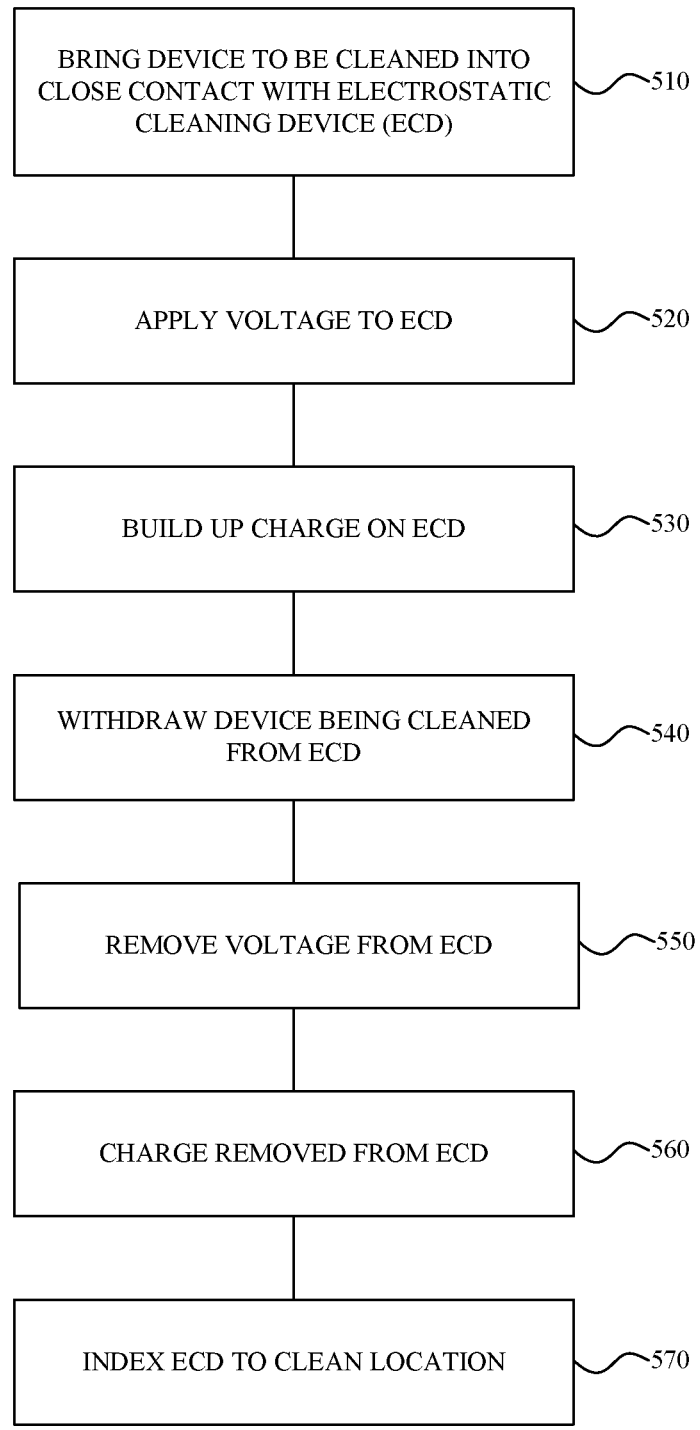
FIG. 5 is a process flow of a cleaning operation in accordance with an embodiment.

FIG. 5 is a process flow of a cleaning operation in accordance with an embodiment. At operation 510 the transfer head assembly 200 (for example, holding the MPA 103 or another micro chip or MEMS device) is brought into close contact with the electrodes 402 of the ECD 400, as also illustrated in FIG. 4B. More specifically, any contamination particles 126 and/or micro devices 124 are brought into close contact with the electrodes 402 of the ECD 400. For example, close contact may be 0-500 nm. At operation 520 a voltage is applied to the ECD 400, and charge is allowed to build up on the electrodes 402 at operation 530. For example, an exemplary operating voltage range may be between 50 V-500 V, or more specifically 100 V. Where a bipolar electrode is used, bipolar operating voltages are applied. Charge buildup may occur rapidly in accordance with embodiments in order to reduce time required for cleaning. For example, charge buildup may occur within approximately 10 milliseconds (ms) or less. The translatable transfer head assembly 200 is then withdrawn vertically away from the ECD 400 at operation 540, resulting in a clean surface (e.g. clean MPA) where contamination previously on the device being cleaned is now retained on the ECD 400. In an embodiment, the translatable transfer head assembly is withdrawn from the ECD 400 with a pure vertical motion. In such a manner, cleaning is accomplished electrostatically, without wiping, which may aid is preserving the mechanical integrity of both the ECD 400 and surface being cleaned (e.g. MPA 103). At operation 550 the voltage is removed from the ECD 400 and the electrodes 402 are discharged at operation 560. At operation 570 the ECD 400 is moved to a different position relative to the transfer head assembly 200 aligning a still clean surface of the ECD 400 under the transfer head. In an embodiment the process flow in FIG. 5 is repeated until the MPA 103 or other microchip is clean.

Figure 6A:
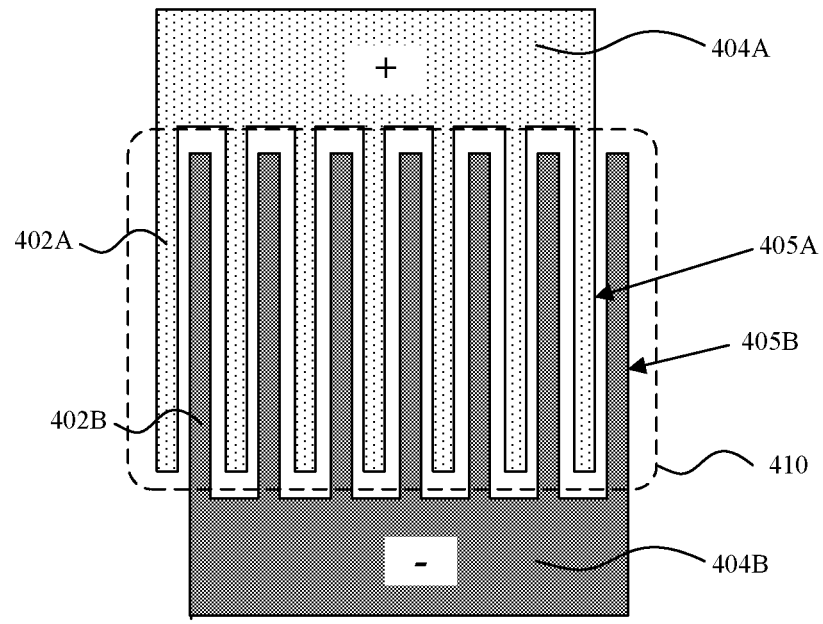
FIG. 6A is a schematic top view illustration of an electrostatic cleaning device prior to cleaning a micro pick up array in accordance with an embodiment.
Figure 6B:
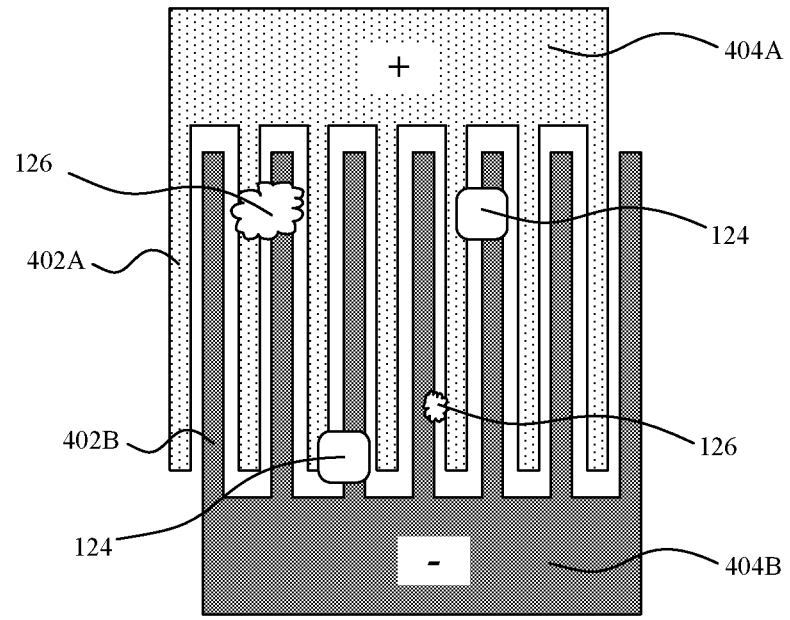
FIG. 6B is a schematic top view illustration of an electrostatic cleaning device after cleaning a micro pick up array in accordance with an embodiment.

FIGS. 6A-6B are schematic top view illustrations of an ECD prior to and after cleaning an MPA in accordance with an embodiment. The particular embodiment illustrated is a bipolar electrode configuration, though other electrode configurations are possible, including monopolar electrode and other multiple electrode configurations. As shown, cleaning electrode area 410 includes a first electrode pattern 405A of first electrodes 402A. In the embodiment illustrated, the first electrode pattern 405 is in a comb configuration and is interdigitated with a second electrode pattern 405B of second electrodes 402B also with a comb configuration, with each comb configuration including interdigitated fingers as electrodes 402A, 402B. A interconnect line 404A is electrically connected with the first electrodes 402A, and a second interconnect line 404B is electrically connected with the second electrodes 402B. In a bipolar configuration, opposite voltages may be applied to 402A, 405A, 404A and 402B, 405B, 404B.

Referring to FIG. 6B, contamination particles 126 and micro devices 124 are retained by at least one electrode 402A, 402B, referred to generically as electrode 402. In accordance with embodiments, precise alignment is not required for cleaning. For example, particle contamination may fall between the ECD 400 electrodes 402 or may be retained one or more electrodes 402, or span across multiple electrodes 402. In the context of micro device transfer and cleaning, the speed of charge build up on the ECD electrodes 402 is determinative of the cleaning cycle time, with small capacitances resulting in faster cycle times. In an embodiment, the ECD 400 is able to attract and retain particles ranging from 0.25 µm to 25 µm, minimum length or width, at an operating voltage of 50 V to 500 V. Size and spacing of the electrodes 402, as well as distance to the particle contamination or micro device, contributes to the ECD pull force. In an embodiment, line width of the electrode 402 fingers is approximately 2 µm, with an approximately 1 µm gap separating adjacent electrode 402 fingers. These dimensions are exemplary, and represent adequate feature sizes that may be obtained using a stepper and lithographic patterning for electrodes 402 definition.

Figure 7:
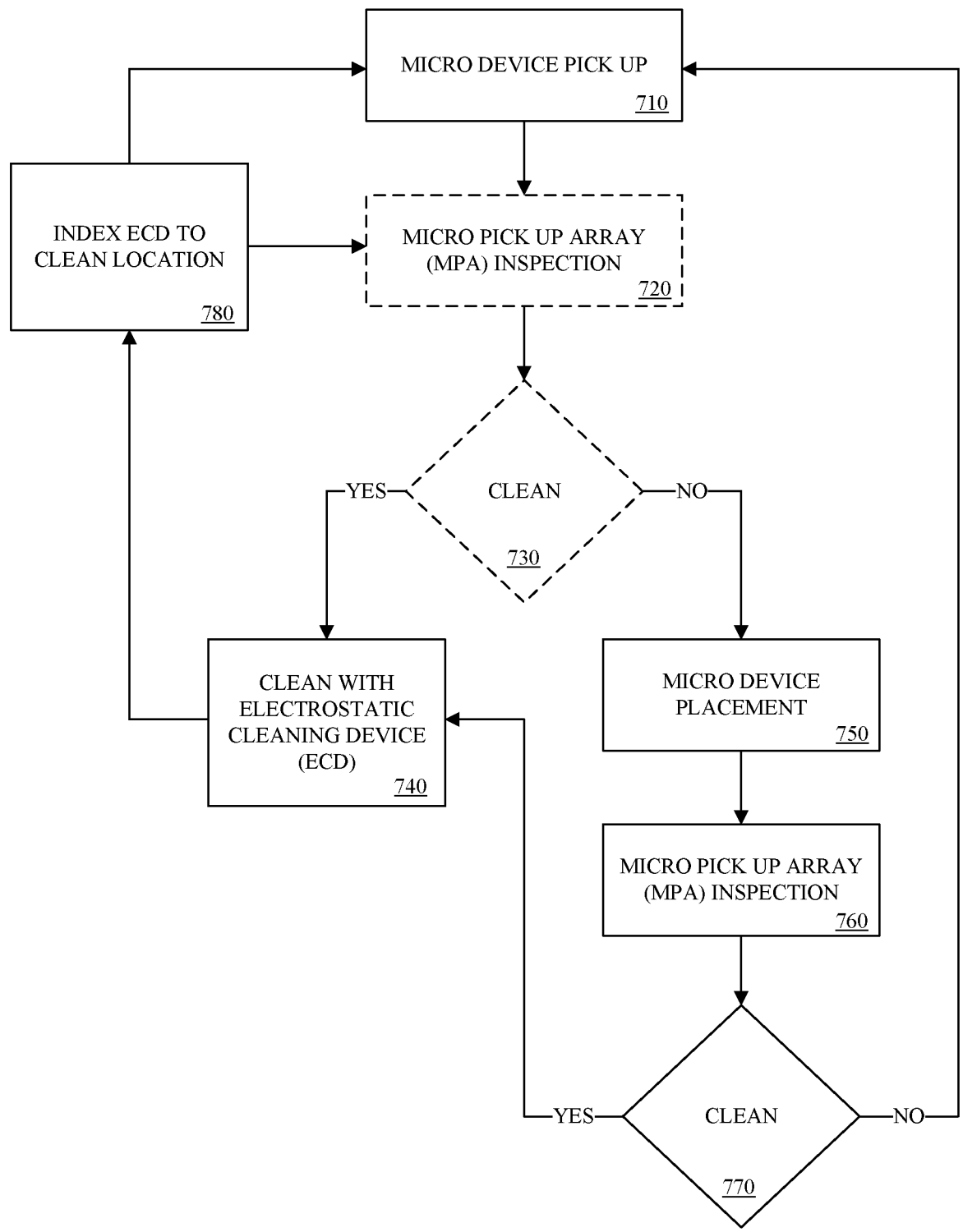
FIG. 7 is a process flow of a method of operating a mass transfer tool including inspection and cleaning in accordance with an embodiment.

FIG. 7 is a process flow of a method of operating a mass transfer tool including inspection and cleaning operations in accordance with an embodiment. At operation 710 a translatable transfer head assembly is positioned over carrier substrate 104 and an array of micro devices 124 is picked up from the carrier substrate with a micro pick up array 103 retained by the translatable transfer head assembly. The translatable transfer head assembly 200 is then translated along the translation track 110 toward the receiving substrate 116. During the translation, the bottom surface of the micro pick up array 103 is inspected by the upward facing inspection camera 120 at inspection operation 720. At operation 730 it is determined whether a cleaning operation is necessary. For example, this may be determined with computer 108. If a threshold amount of micro devices were not picked up or contamination particles are detected, then the MPA 103 is cleaned at operation 740. Following the cleaning operation 740, the ECD is indexed to a clean location at operation 780. For example, the ECD can be indexed my moving the cleaning stage 112 in an x and/or y direction. The MPA 103 may then be moved over the carrier substrate to restart the pick and place procedure or the inspection operation 720 or cleaning operation 730 may optionally be repeated. If a cleaning operation was not necessary, then the micro devices picked up at operation 710 are placed on the receiving substrate at operation 750. The translatable transfer head assembly 200 is then translated along the translation track 110 toward the carrier substrate 114. During the translation, the bottom surface of the micro pick up array 103 is inspected by the upward facing inspection camera 120 at inspection operation 760. At operation 770 it is determined whether a cleaning operation is necessary. For example, this may be determined with computer 108. If any micro devices remain on the MPA 103 or a threshold amount of contamination is observed, then the MPA is cleaned at operation 740. If a cleaning operation is not required, then the transfer head assembly is moved over the carrier substrate and the pick and place procedure can be repeated.

Figure 8:
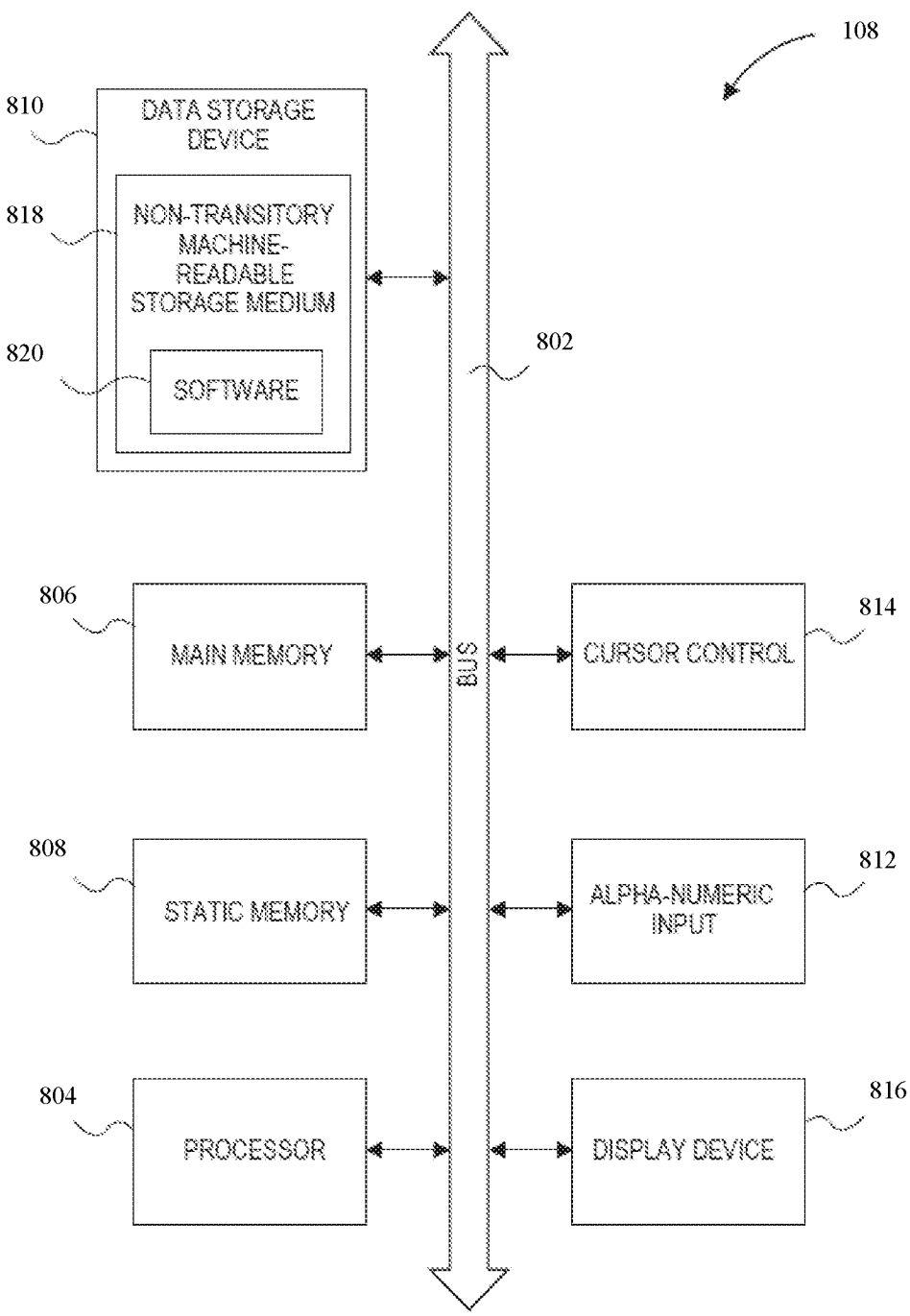
FIG. 8 is a schematic illustration of a computer system in accordance with an embodiment.

Referring to FIG. 8, a schematic illustration of a computer system is shown that may be used in accordance with an embodiment. Portions of embodiments are comprised of or controlled by non-transitory machine-readable and machine-executable instructions that reside, for example, in machine-usable media of a computer 108. Computer 108 is exemplary, and embodiments may operate on or within, or be controlled by a number of different computer systems including general purpose networked computer systems, embedded computer systems, routers, switches, server devices, client devices, various intermediate devices/nodes, stand-alone computer systems, and the like.

Computer 108 of FIG. 8 includes an address/data bus 802 for communicating information, and a central processor 804 coupled to bus 802 for processing information and instructions. Computer 108 also includes data storage features such as a computer usable volatile memory, e.g. random access memory (RAM) 806, coupled to bus 802 for storing information and instructions for central processor 804, computer usable non-volatile memory 808, e.g. read only memory (ROM), coupled to bus 802 for storing static information and instructions for the central processor 804, and a data storage device 810 (e.g., a magnetic or optical disk and disk drive) coupled to bus 802 for storing information and instructions. Computer 108 of the present embodiment also includes an optional alphanumeric input device 812 including alphanumeric and function keys coupled to bus 802 for communicating information and command selections to central processor 804. Computer 108 also optionally includes an optional cursor control 814 device coupled to bus 802 for communicating user input information and command selections to central processor 804. Computer 108 of the present embodiment also includes an optional display device 816 coupled to bus 802 for displaying information.

The data storage device 810 may include a non-transitory machine-readable storage medium 818 on which is stored one or more sets of instructions (e.g. software 820) embodying any one or more of the methodologies or operations described herein. For example, software 820 may include instructions, which when executed by processor 804, cause computer 108 to control mass transfer tool 100 as described above for performing pick and place, inspection, and cleaning operations. Software 820 may also reside, completely or at least partially, within the volatile memory, non-volatile memory 808, and/or within processor 804 during execution thereof by computer 108, volatile memory 806, non-volatile memory 808, and processor 804 also constituting non-transitory machine-readable storage media.

Figure 9A:
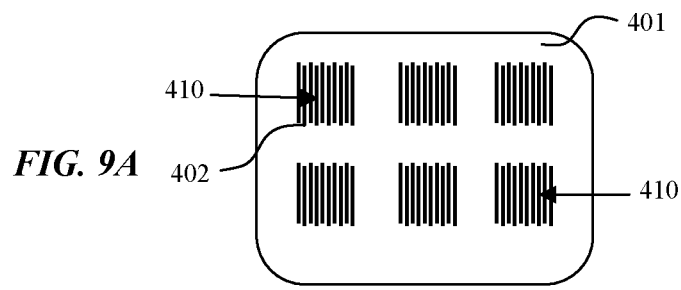
FIGS. 9A-9E are schematic top view illustrations of a method of forming an electrostatic cleaning device in accordance with an embodiment.
Figure 9B:
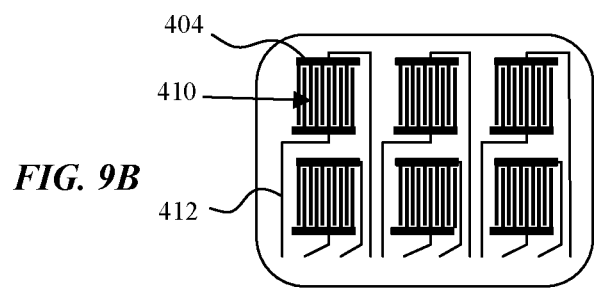
Figure 9C:
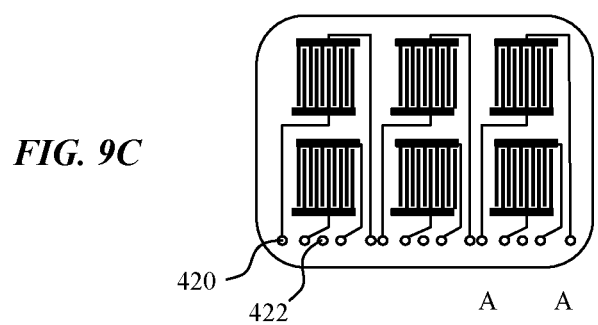
Figure 9D:
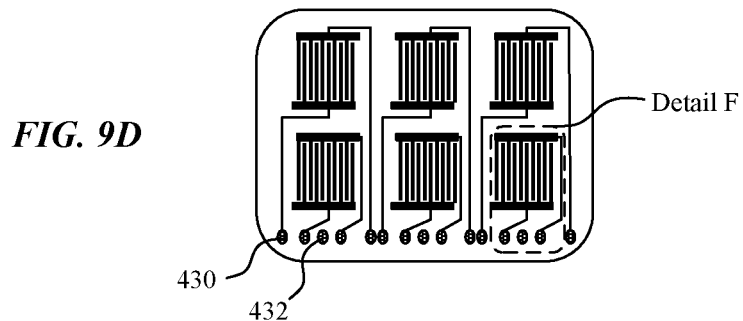
Figure 9E:
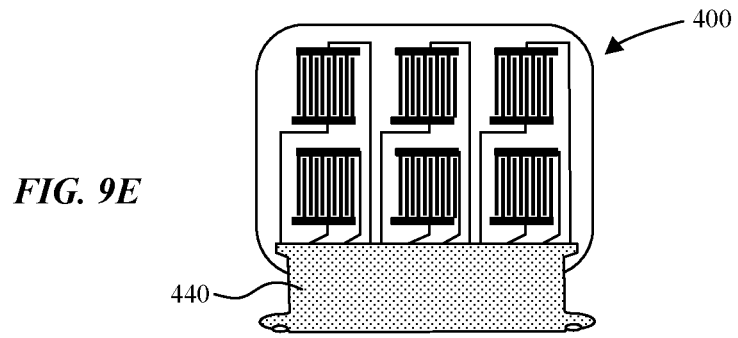

Referring now to FIGS. 9A-9E schematic top view illustrations are provided of a method of forming an electrostatic cleaning device in accordance with an embodiment. As shown in FIG. 9A, one or more cleaning electrode areas 410 are formed on or in substrate 401. In an embodiment, a plurality of laterally separate cleaning electrode areas 410 are formed in the substrate 401. For example, this may be accomplished by etching electrodes 402 into the substrate 401. Following the formation of the one or more cleaning electrode areas 410, interconnect lines 404 and trace lines 412 are formed. For example this may be accomplished by etching interconnects lines 404 and trace lines 412 into the substrate 401. In an embodiment, each separate cleaning electrode area 410 includes separate corresponding trace lines 412. A dielectric layer may then be formed over the substrate 401, covering the cleaning electrode areas 410, interconnect lines 404, and trace lines 412. Referring now to FIG. 9C, electrode contact holes 420, and optionally ground contact holes 422 are formed. For example, electrode contact holes 420 may be formed through the dielectric layer to expose the trace lines 412, and the ground contact holes 422 may be formed into the substrate 401. Conductive contacts 430, 432 may then be formed over the electrode contact holes 420 and ground contact holes 422 as illustrated in FIG. 9D. A close up view of Detail F shown in FIG. 9D is described in further detail below with regard to FIG. 9F. Referring now to FIG. 9E, in an embodiment, a flex circuit 440 is coupled with the conductive contacts 430, 432 on the substrate 401. For example, the flex circuit 440 can be used to connect the ECD 400 with operating voltage contacts, and optionally a ground on the cleaning stage 112. In an embodiment, the flex circuit 440 includes or is coupled with a multiplexer in order to independently control each of the separate cleaning electrode areas 410 such that only a single cleaning electrode area 410 is charged at a time in the resultant ECD 400. Inclusion of a flex circuit is not required, however. For example, in an embodiment, via plugs are formed in the substrate 401 for providing back side contacts.

Figure 9F:
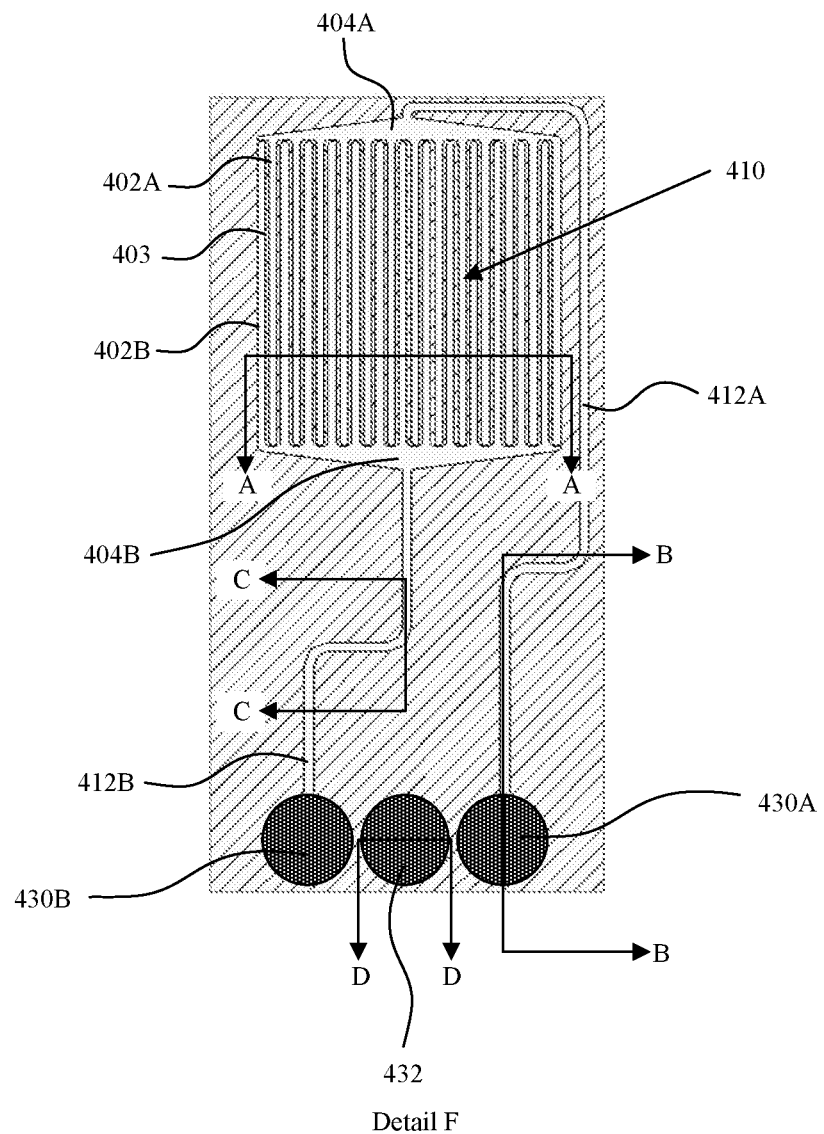
FIG. 9F is a schematic top view illustration of Detail F in FIG. 9D in accordance with an embodiment.

Referring now to FIG. 9F, a close up illustration of Detail F in FIG. 9D is provided in accordance with an embodiment. As illustrated, electrode trace line 412A is coupled with interconnect line 404A, which in turn is connected with the first electrode pattern 405A (as described above), and electrode trace line 412B is coupled with interconnect line 404B, which in turn is connected with the second electrode pattern 405B (as described above). In the embodiment illustrated, the first and second electrode patterns 405A, 405B form an interdigitated comb configuration, and the interconnect lines 404A, 404B are on opposite sides of the cleaning electrode area 410. Also illustrated, the trace lines 412A, 412B are connected at midpoints of the interconnect lines 404A, 404B.

FIGS. 10A-18C are schematic cross-sectional side view illustrations taken along lines A-A, B-B, C-C, and D-D in FIG. 9F and schematic top view illustrations of a method of forming an electrostatic cleaning device in accordance with an embodiment. Thus, it is to be appreciated that FIGS. 10A-18C are condensed schematic views combining structural features from various areas of the substrate used to form the ECD. Furthermore, in the following description a method and structure for forming an ECD are described, beginning with a silicon-on-insulator (SOI) substrate. The following description is exemplary of one method of forming an ECD, and embodiments are not so limited. For example, it is not required to use silicon, or an SOI substrate for the formation of an ECD, and other materials and substrates may be used.

Referring now to FIGS. 10A-10B, in an embodiment, the substrate 401 includes a base substrate 404, insulator layer 406, and device layer 408. For example, substrate 401 may be an SOI substrate including a silicon base substrate 404, silicon device layer 408, and buried oxide (e.g. $SiO_2$) layer 406. In an embodiment, substrate 401 is an SOI substrate with (100) base Si substrate 404 with a thickness of approximately 500 μm, approximately 1 μm thick insulator layer 406, and approximately 2 μm thick device layer 408. In an embodiment, device layer 408 is doped. For example, device layer may be doped with boron for a resistivity of 0.01-0.1 ohm·cm.

Referring to FIGS. 11A-11B, the cleaning electrode areas 410 may be etched into the device layer 408. As shown, electrodes 402 (including 402A, 402B) are formed in the device layer 408 with gaps 403 separating adjacent electrode 402 lines. In an embodiment, electrode 402 lines are approximately 2 μm wide, and separated by a gap 403 of approximately 1 μm. In an embodiment, photoresist is patterned with a stepper, followed by dry reactive ion etching (DRIE) to etch the gaps 403 into the device layer 408, stopping on the underlying insulator layer 406.

Figure 14B:
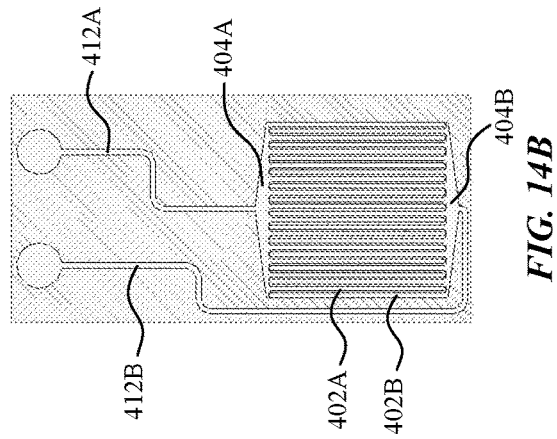
Figure 14A:
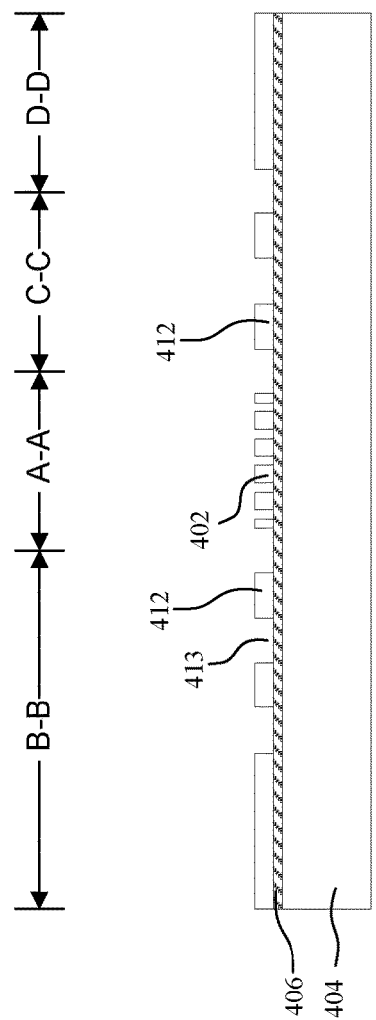

A photoresist layer 422 may then be formed over the patterned device layer 408 as illustrated in FIGS. 12A-12B, followed by the formation of openings 413 in the photoresist layer 422 as illustrated in FIGS. 13A-13B. As show, the covered portions of the photoresist layer 422 will correspond to the interconnect lines 404A, 404B and trace lines 412A, 412B. Referring now to FIGS. 14A-14B, the device layer 408 is then etched through openings 413, stopping on the insulator layer 406 to form the interconnect lines 404A, 404B and trace lines 412A, 412B.

Figure 15B:
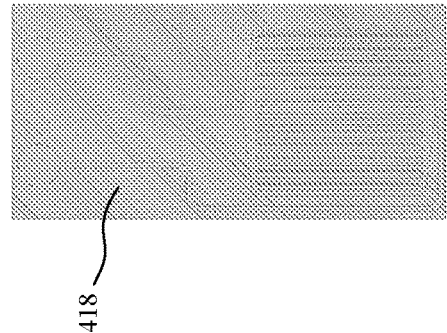
Figure 15A:
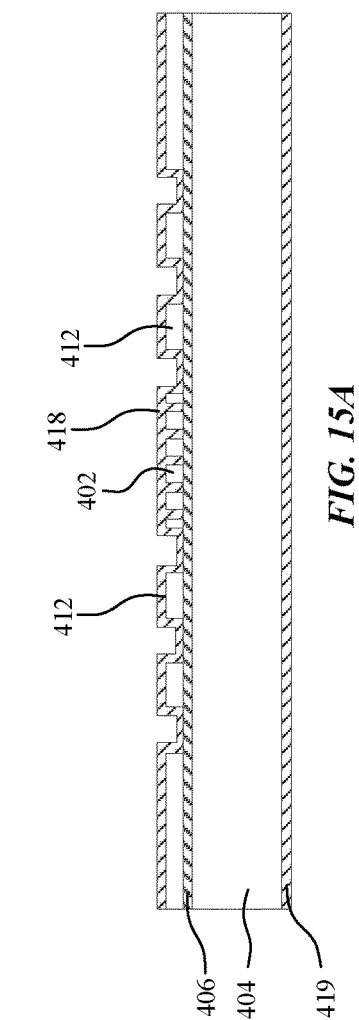

A dielectric layer 418 is then formed over the patterned device layer 408 as illustrated in FIGS. 15A-15B. As shown, dielectric layer 418 may be formed over the cleaning electrode area 410 including electrodes 402, interconnect lines 404, and trace lines 412. In an embodiment, the dielectric layer is $SiO_2$ or $Al_2O_3$. In an embodiment, the dielectric layer 418 is formed by atomic layer deposition (ALD). For example, the dielectric layer 418 may be approximately 0.5 μm thick ALD $Al_2O_3$. In other embodiments, alternative materials and thicknesses may be used to accomplish a specified capacitance of the ECD 400. Dielectric layer 418 may also include multiple dielectric layers.

Referring now to FIGS. 16A-17B, electrode contact holes 420, and optionally ground contact holes 422 are formed. For example, electrode contact holes 420 may be formed through the dielectric layer 418 to expose the trace lines 412 using a suitable technique such as ion milling through the $Al_2O_3$ layer, and the ground contact holes 422 may be formed through the device layer 408 and insulator layer 406 using a suitable technique such as reactive ion etching (RIE) to expose the base substrate 404. Conductive contacts 430, 432 may then be formed over the electrode contact holes 420 and ground contact holes 422 as illustrated in FIG. 18A-18B, with the conductive contacts 430 making electrical contact with the trace lines 412 and the conductive ground contacts 432 making electrical contact with the base substrate 404. In an embodiment, the conductive contacts 430, 432 are formed of a TiW/Au metal layer stack. For example, the conductive contacts 430, 432 may be formed by blanket deposition followed by wet etching.

FIG. 18C is a cross-sectional side view illustration of ECD including one or more via plugs 450 formed within a via opening 452 in the base substrate 404. With such a configuration, the via plug 450 is electrically isolated from the base substrate 404. As illustrated the conductive contact 430 is formed through the device layer 408 and insulator layer 406, and on the via plug 450. The conductive contact 430 makes electrical contact with the corresponding trace line 412 and via plug 450. A back side contact 454 is formed on the bottom surface of the via plug to make a back side electrical connection with the ECD 400. Back side contact 454 may be formed of a similar material as conductive contact 430.

In utilizing the various aspects of the embodiments, it would become apparent to one skilled in the art that combinations or variations of the above embodiments are possible for forming an ECD and MTT with integrated ECD. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electrostatic cleaning device comprising:
   a cleaning electrode area including a first electrode pattern including a plurality of first fingers, and a second electrode pattern including a plurality of second fingers, wherein the plurality of first fingers are laterally parallel to and interdigitated with the plurality of second fingers;
   a first trace line connected to the first electrode pattern; and
   a dielectric layer covering the cleaning electrode area and the first trace line.

2. The electrostatic cleaning device of claim 1, wherein the first electrode pattern includes a comb configuration and the second electrode pattern includes a comb configuration.

3. The electrostatic cleaning device of claim 1, further comprising:
   a second trace line connected to the second electrode pattern; and
   wherein the dielectric layer covers the cleaning electrode area, the first trace line and the second trace line.

4. The electrostatic cleaning device of claim 3, wherein the cleaning electrode area, the first trace line, and the second trace line are formed in a silicon layer.

5. The electrostatic cleaning device of claim 4, further comprising a base substrate, and an insulator layer between the silicon layer and the base substrate.

6. The electrostatic cleaning device of claim 3, further comprising a plurality of additional electrically separate cleaning electrode areas and a corresponding plurality of additional electrically separate first trace lines, and the dielectric layer covers each additional cleaning electrode area and each additional first trace line.

7. The electrostatic cleaning device of claim 6, wherein each additional cleaning electrode area includes an additional second electrode pattern interdigitated with an additional first electrode pattern, and further comprising a corresponding plurality of additional electrically separate second trace lines.

8. The electrostatic cleaning device of claim 1, further comprising a flex circuit coupled with the first trace line.

9. An electrostatic cleaning device comprising:
   a plurality of electrically separate cleaning electrode areas, each cleaning electrode area including a first electrode pattern and a second electrode pattern interdigitated with the first electrode pattern;
   a corresponding plurality of electrically separate first trace lines, each first trace line connected to the first electrode pattern;
   a corresponding plurality of electrically separate second trace lines, each second trace line connected to the second electrode pattern;
   a dielectric layer covering each cleaning electrode area, each first trace line, and each econ trace line;
   a first corresponding plurality of conductive contacts electrically coupled with the plurality of electrically separate first trace lines; and
   a second corresponding plurality of conductive contacts electrically coupled with the plurality of electrically separate second trace lines.

10. The electrostatic cleaning device of claim 9, wherein the plurality of conductive contacts are electrically coupled with a plurality of via plugs.

11. The electrostatic cleaning device of claim 9, further comprising a conductive ground contact.

12. The electrostatic cleaning device of claim 11, further comprising a flex circuit coupled with the first corresponding plurality of conductive contacts, the second corresponding plurality of conductive contacts, and the conductive ground contact.

13. A mass transfer tool comprising:
    a carrier substrate stage;
    a receiving substrate stage;
    an electrostatic cleaning stage;
    an electrostatic cleaning device that is detachably coupleable with the electrostatic cleaning stage, wherein the electrostatic cleaning device comprises:
       a cleaning electrode area including a first electrode pattern including a plurality of first fingers and a second electrode pattern including a plurality of second fingers, wherein the plurality of first fingers are laterally parallel to and interdigitated with the plurality of second fingers;
       a first trace line connected to the first electrode pattern; and
       a dielectric layer covering the cleaning electrode area and the first trace line; and
    a translatable transfer head assembly that is translatable over the carrier substrate stage, the receiving substrate stage, and the electrostatic cleaning stage.

14. The mass transfer tool of claim 13, further comprising a translation track, wherein the translatable transfer head assembly is coupled with the translation track and the translatable transfer head assembly is movable along the translation track over the carrier substrate stage, the receiving substrate stage, and the electrostatic cleaning stage.

15. The mass transfer tool of claim 13, further comprising an upward facing inspection camera.

16. The mass transfer tool of claim 13, wherein the upward facing inspection camera is located between the receiving substrate stage and the carrier substrate stage.

17. The mass transfer tool of claim 13, further comprising a pair of voltage sources to supply separate operating voltages to the electrostatic cleaning device.

18. The mass transfer tool of claim 13, further comprising a micro pick up array including an array of bipolar electrostatic transfer heads that is detachably coupleable with the translatable transfer head assembly.

19. A micro device transfer and cleaning method comprising:
    picking up an array of micro devices with a micro pick up array;
    placing the array of micro devices on a receiving substrate;
    inspecting the micro pick up array to locate a micro device retained on the micro pick up array after placing the array of micro devices on the receiving substrate; and cleaning the micro pick up array with an electrostatic cleaning device to remove the micro device from the micro pick up array;

wherein the electrostatic cleaning device comprises:
- a cleaning electrode area including a first electrode pattern including a plurality of first fingers and a second electrode pattern including a plurality of second fingers, wherein the plurality of first fingers are laterally parallel to and interdigitated with the plurality of second fingers;
- a first trace line connected to the first electrode pattern; and
- a dielectric layer covering the cleaning electrode area and the first trace line.

20. The method of claim 19, wherein cleaning the micro pick up array with the electrostatic cleaning device comprises:

bringing the micro pick up array into close contact with the electrostatic cleaning device;

applying a voltage to the electrostatic cleaning device to build up charge on the electrostatic cleaning device; and withdrawing the micro pick up array from the electrostatic cleaning device.

21. The method of claim 19, further comprising removing the voltage from the electrostatic cleaning device to remove the charge from the electrostatic cleaning device, and indexing the electrostatic cleaning device to a clean location.

* * * * *